US008145958B2

(12) United States Patent
Aitken et al.

(10) Patent No.: US 8,145,958 B2
(45) Date of Patent: Mar. 27, 2012

(54) INTEGRATED CIRCUIT AND METHOD FOR TESTING MEMORY ON THE INTEGRATED CIRCUIT

(75) Inventors: Robert Campbell Aitken, San Jose, CA (US); Gary Robert Waggoner, San Jose, CA (US)

(73) Assignee: ARM Limited, Cambridge (GB)

( * ) Notice: Subject to any disclaimer, the term of this patent is extended or adjusted under 35 U.S.C. 154(b) by 1170 days.

(21) Appl. No.: 11/270,818

(22) Filed: Nov. 10, 2005

(65) Prior Publication Data

US 2007/0106923 A1    May 10, 2007

(51) Int. Cl.
*G11C 29/00* (2006.01)
*G01R 31/28* (2006.01)

(52) U.S. Cl. ........ 714/718; 714/719; 714/726; 714/727; 714/729; 714/738; 714/742; 365/200; 365/201

(58) Field of Classification Search ............... 714/718, 714/719, 726, 727, 729, 738, 742; 365/200, 365/201

See application file for complete search history.

(56) References Cited

U.S. PATENT DOCUMENTS

| 4,969,148 | A | 11/1990 | Nadeau-Dostie et al. | |
| 6,191,603 | B1 | 2/2001 | Muradali et al. | |
| 6,587,979 | B1 * | 7/2003 | Kraus et al. | 714/720 |
| 7,117,413 | B2 * | 10/2006 | Park et al. | 714/727 |

OTHER PUBLICATIONS

Fang et al., "Power-Constrained Embedded Memory BIST Architecture", 2003, IEEE International Symposium on Defect and Fault Tolerance in VLSI Systems, pp. 451-458.*
DaSilva et al., "Overview of the IEEE P1500 Standard", 2003, ITC International Test Conference, pp. 988-997.*
Benso et al., "Programmable Built-In Self-Testing of Embedded RAM Clusters in System-on-Chip Architectures", Sep. 2003, IEEE Communications Magazine, pp. 90-97.*
Dervisoglu, "A Unified DFT Architecture for use with IEEE 1149.1 and VSIA/IEEE P1500 Compliant Test Access Controllers", Jun. 18-22, 2001, DAC 2001, pp. 53-58.*
Li, et al., "A Hierarchical Test Scheme for System-on-Chip Designs", Mar. 4-8, 2002, Design, Automation and Test in Europe Conference and Exhibition (DATE'02), pp. 486-490.*
Bodoni et al., *An Effective Distributed BIST Architecture for RAMs*, 6 pages.

* cited by examiner

*Primary Examiner* — John J Tabone, Jr.
(74) *Attorney, Agent, or Firm* — Nixon & Vanderhye P.C.

(57) ABSTRACT

An integrated circuit and method for testing memory on the integrated circuit are provided. The integrated circuit has processing logic for performing data processing operations on data, and a plurality of memory units for storing data for access by the processing logic. Further, memory test logic is provided to perform a sequence of tests in order to seek to detect memory defects in the memory units. The memory test logic comprises a plurality of test wrapper units, each test wrapper unit associated with one of the memory units and being operable to execute tests on the associated memory unit, and a test controller for controlling performance of the sequence of tests by communicating with each of the test wrapper units to provide test data defining each test to be executed by that test wrapper unit. Further, a first communication link is provided for connecting each of the test wrapper units directly to the test controller, and a second communication link is provided for connecting each test wrapper unit in an ordered sequence with the test controller. When controlling performance of the sequence of tests, the test controller provides first test data via the first communication link and second test data via the second communication link. It has been found that such an approach provides a particularly efficient and flexible technique for performing BIST functions within the integrated circuit.

14 Claims, 9 Drawing Sheets

| VALUE IN ADDRESS REG | RECIPIENT REGISTER | INTERFACE USED | NUMBER OF BITS TO SHIFT |
|---|---|---|---|
| 000 | COMMAND REG | REG_SI | 4 |
| 001 | INSTRUCTION REG | REG_SI | 23 |
| 010 | DISABLE/BYPASS REG | SI | 2 |
| 011 | RECONFIG REG | SI | 7 |
| 100 | STATUS REG | SI | 6 |
| 101 | START ADDR REG | REG_SI | 8 |
| 110 | WRITE MASK REG | REG_SI | 5 |
| 111 | FULL SERIAL REG | SI | 149 |

FIG 3B

Wrapper Command Register Operation

INTEGRATED CIRCUIT AND METHOD FOR TESTING MEMORY ON THE INTEGRATED CIRCUIT

BACKGROUND OF THE INVENTION

1. Field of the Invention

The present invention relates to an integrated circuit and method for testing memory on the integrated circuit.

2. Description of the Prior Art

It is becoming more and more common for integrated circuits to include embedded memory to allow rapid access to data by processing logic provided on the integrated circuit. As the use of embedded memory continues to increase, thorough testing and defect diagnosis has become a key requirement to ensure product quality and enhance product yield. Whilst embedded memory presents significant system performance and cost reduction advantages, it brings its own testing issues. Externally generated test vector style tests are not suitable for verifying embedded memory arrays for a number of reasons. Firstly, the time spent in the manufacturing test grows exponentially as the embedded memory die area increases, which often makes such test vector style testing too costly. Furthermore, it is sometimes not possible to create a set of vectors that can detect all possible types of memory defect.

A known technique which alleviates such problems is to provide the integrated circuit with a memory Built In Self-Test (BIST) controller. In simplistic terms, a memory BIST controller is an on-chip utility that enables the execution of a proven set of algorithmic style verification tests directly on the embedded memory. These tests can be executed at the design's full operating frequency to prove the memory operations and identify errors caused by silicon defects.

In accordance with one known technique, a separate BIST controller is provided for each embedded memory within the integrated circuit. However, as the number of memory circuits provided within the integrated circuit increases, such an approach results in the chip area devoted to testing becoming unacceptably large. Hence, techniques have been developed which enable the BIST controller to be shared amongst several embedded memories within the integrated circuit. One such technique is described in U.S. Pat. No. 4,969,148, where, as for example shown in FIGS. 6 and 7 of that document, a single controller is shared between a number of embedded RAM (Random Access Memory) blocks within the integrated circuit. As can be seen from those figures, this technique involves providing a two-input multiplexer assembly in association with the data in port of each RAM block.

In the example of FIG. 6 of U.S. Pat. No. 4,969,148, the RAM blocks are connected in a daisy chain arrangement, such that the data input line of RAM 1 is connected to the serial data out port of the controller, the data output line of RAM 1 is connected to the data input line of RAM 2, the data output line of RAM 2 is connected to the data input line of RAM 3 and the data output line of RAM 3 is connected to the serial data in port of the controller. When in the test mode, the controller can operate at the system clock speed and serially shifts test bits from its serial data out port through the sequence of RAM blocks via the associated multiplexer assemblies, with the output from the last RAM block being returned to the serial data in port of the controller. During this test process, the same address is provided to each of the RAM blocks in parallel. This arrangement for sharing the test circuitry simplifies the testing procedure since the three memories are treated as if they were one large memory. In accordance with an alternative embodiment shown in FIG. 7 of U.S. Pat. No. 4,969,148, a RAM select counter and associated "1 of 3" multiplexer is used to provide an arrangement where only one of the memories is tested at a time.

U.S. Pat. No. 6,191,603 describes a modular embedded test system for use in integrated circuits. In accordance with this technique, a number of core modules are provided, and each core may possess BIST functions which can be activated using external commands. An access scan chain is provided for controlling tests performed on each core, and a separate data scan chain is provided to apply specific test vectors and observe their responses.

The article "An Effective Distributed BIST Architecture for RAMs" by M Bodoni et al, Proceedings of the IEEE European Test Workshop (ETW '00), describes a BIST architecture employing a single BIST processor used to test all the memories of the system, and a wrapper for each SRAM including standard memory BIST modules. The architecture employs a normal test scan chain (NTScan) and a results scan chain (Resscan), and commands for these two scan chains, along with synchronisation signals used to forward test primitives to the wrappers, are multiplexed within each wrapper to reduce routing overhead. March tests (or test algorithms) are applied one memory operation at a time, and as a result multiple operations cannot be applied at system clock speed.

As the number of memory units embedded within the integrated circuit increases, then this results in an increase in the complexity of the interface between those memory units and a shared BIST controller for those memory units. The known BIST controller sharing techniques become complex to manage as the number of memory units increase, and further lack flexibility with regard to the tests to be applied on each of the memory units.

It would be desirable to provide a technique which provided a communication scheme between the controller and an arbitrary number of associated memory units, which allowed those multiple memory units to be tested in parallel at operating frequency, with the communication scheme being readily able to cope with increased numbers of memory units, and providing a flexible approach for organising the tests to be performed.

SUMMARY OF THE INVENTION

Viewed from a first aspect, the present invention provides an integrated circuit, comprising: processing logic operable to perform data processing operations on data; a plurality of memory units operable to store data for access by the processing logic; and memory test logic operable to perform a sequence of tests in order to seek to detect memory defects in the plurality of memory units; the memory test logic comprising: a plurality of test wrapper units, each test wrapper unit associated with one of said memory units and being operable to execute tests on its associated memory unit; a test controller operable to control performance of the sequence of tests by communicating with each of the test wrapper units to provide test data defining each test to be executed by that test wrapper unit; a first communication link operable to connect each of the test wrapper units directly with the test controller; and a second communication link operable to connect each test wrapper unit in an ordered sequence with the test controller; when controlling performance of the sequence of tests, the test controller being operable to provide first test data via the first communication link and second test data via the second communication link.

In accordance with the present invention memory test logic is provided which comprises a plurality of test wrapper units, each test wrapper unit being associated with one of the memory units, and a test controller for controlling performance of a sequence of tests by communicating with each of the test wrapper units to provide test data defining each test to be executed by that test wrapper unit. Furthermore, a plurality of communication links are provided for enabling the test controller to communicate with the test wrapper units. In particular, a first communication link connects each of the test wrapper units directly with the test controller, whilst a second communication link connects each test wrapper unit in an ordered sequence with the test controller. When controlling performance of the sequence of tests, the test controller can provide test data via either of the first or second communication links. This approach has been found to be very flexible, since the individual test wrapper units associated with each of the memory units execute the tests on the associated memory unit, and the controller can communicate the test data to each test wrapper unit via either communication link, thereby providing flexibility in how the tests are set up for execution by each test wrapper unit. Furthermore, this approach is readily scalable for increased numbers of memory units, since all that is required is to provide additional test wrapper units coupled with the test controller via the first and second communication links. Such an approach hence allows an arbitrary number of test wrapper units to be connected to a single controller.

In one embodiment of the present invention, the first communication link can transmit data that is not fixed by its architecture, and hence the first communication link can be configured to send arbitrary data to an arbitrary number of test wrapper units without changing the underlying physical architecture. The first communications link is hence efficient and scalable.

Exactly which test data is sent via the first communication link or the second communication link can vary dependent on the implementation. However, in one embodiment, the first test data is test data required by each of the test wrapper units, and the first communication link is used to broadcast that first test data to the plurality of test wrapper units. Hence, in such embodiments, the first communication link provides a very efficient mechanism for disseminating global test data required by each of the test wrapper units. Given that each of the test wrapper units are connected directly with the test controller via the first communication link, such test data can be disseminated in parallel to the plurality of test wrapper units. By arranging the first communication link to broadcast the first test data to the plurality of test wrapper units, it has been found that a significant reduction in wiring overhead can be achieved. In addition, such an approach can allow a ready reconfiguration of the test wrapper units as and when required.

In one embodiment, the second test data is test wrapper unit specific test data, and the second communication link is used to output a sequence of blocks of second test data, each block being received by one of the test wrapper units. Hence, device specific test data can in such embodiments be routed through the second communication link, so as to allow each test wrapper unit to receive its own tailored test data.

In one embodiment, the test controller is operable to periodically issue an identifier signal over the first communication link, the plurality of test wrapper units being operable to determine from the identifier signal whether test data provided subsequent to the identifier signal will be received over the first communication link or the second communication link. This provides an efficient mechanism for controlling the dissemination of test data via the first and second communication links. In one embodiment, the identifier signal is issued for each logical grouping of test data to be provided.

In one embodiment, test results obtained from execution of a test are communicated from each test wrapper unit to the test controller via the second communication link. In one particular embodiment, these test results are shifted out of each test wrapper unit as new test wrapper unit specific test data is shifted into the test wrapper units from the test controller.

The first and second communication links can take a variety of forms. However, in one embodiment the first and second communication links are serial data links. Hence, individual test data bits output on these communication links are shifted into the test wrapper unit and out from the test wrapper unit in respective clock cycles.

It is known to provide test circuitry within an integrated circuit with its own test clock, typically the test clock being at a lower frequency than the system clock used to run other elements of the integrated circuit. However, such an approach requires the routing of the test clock signal to the various elements of the test logic. In one embodiment, the test controller is operable to use a test clock signal and each of the plurality of test wrapper units are operable to use one or more system clock signals, each system clock signal having a higher frequency than the test clock signal, and the test controller is operable to output a synchronisation signal over the first communication link to trigger the plurality of test wrapper units to read test data from the first or second communication links. By such an approach, there is no need to route the test clock to each of the test wrapper units, thereby significantly reducing wiring complexity. Instead, the test wrapper units can use the system clock signal(s) that already needs to be routed to the plurality of memory units with which those test wrapper units are associated, and the synchronisation signal output over the first communication link is used to trigger the test wrapper units to read test data from either the first or second communication links. Typically the test wrapper units will be placed in reasonably close proximity to the memory units with which they are associated and hence the routing of the system clock signal(s) to the test wrapper units involves little overhead.

The test wrapper units can take a variety of forms. However, in one embodiment, each test wrapper unit comprises a test engine operable to execute a test; a plurality of registers operable to store test data for access by the test engine; and register control logic operable to receive a register identifier over the first communication link, the register identifier identifying which of said plurality of registers is to receive test data subsequently received by the test wrapper unit from either the first communication link or the second communication link. In one embodiment, each register in the plurality is associated with either the first communication link or the second communication link, such that when the register identifier identifies a particular register, it is then predetermined which communication link that register will receive its test data from.

In one embodiment, said plurality of registers include a command register, when the register identifier received over the first communication link identifies the command register, the subsequent data on the first communication link being stored in the command register to identify a command to be performed by the test engine. Hence, the dissemination of commands to the various test wrapper units can be performed in a particularly efficient manner, through the identification of the command register via the register identifier, followed by the broadcast of the required command over the first communication link for storage in the command register of each test wrapper unit.

There will typically be a variety of different commands which can be stored in the command register. In one embodiment, said plurality of registers include an instruction register, and when the command in the command register comprises a run test command, the test engine is operable to execute a test specified by an instruction in the instruction register. By such an approach, a particular BIST test pattern can be specified via an instruction in the instruction register, and hence when the command comprises a run test command, this will cause the BIST test as specified by that test pattern to be initiated.

In one embodiment, said plurality of registers include a disable register, when the register identifier received over the first communication link identifies the disable register, the subsequent data received over the second communication link being stored in the disable register to identify whether the test wrapper unit is enabled or disabled; and when the test wrapper unit is disabled the other registers in the plurality of registers are arranged to hold whatever data they held before the test wrapper unit was disabled. Since the second communication link is used in one embodiment to distribute test wrapper unit specific test data to each of the test wrapper units, it will be appreciated that by such an approach each of the test wrapper units can be arranged to receive via the second communication link for storage in the disable register individually tailored enable/disable information, so that individual test wrapper units can be selectively disabled. Whilst a particular test wrapper unit is disabled, it holds whatever data was held in its registers before it was disabled, and the registers are still available for scanning. However, the test wrapper unit does not take any actions resultant on the register contents until it is subsequently re-enabled. The use of the disable register, and the selection of that disable register via the first communication link, provides a particularly efficient technique for providing selective enablement and disablement of particular test wrapper logic units.

In one particular embodiment, said plurality of registers include a shadow disable register, when the register identifier received over the first communication link identifies the disable register, the subsequent data received over the second communication link being shifted into the shadow disable register to update that shadow disable register; and when the update of the shadow disable register is complete the content of the shadow disable register being copied to the disable register to identify whether the test wrapper unit is enabled or disabled. Through the use of such a shadow disable register, it can be ensured that there is no ambiguity as to whether the test wrapper unit is enabled or disabled whilst data is being shifted into the disable register. In particular, during the period that the data is being shifted into the shadow disable register, the contents of the disable register itself are not changed, and accordingly the test wrapper unit will remain enabled. Only once the shifting process has been completed will the content of the actual disable register be updated to indicate whether the test wrapper unit is still enabled, or instead has been disabled. To cause a disabled test wrapper unit to be re-enabled, it will first be necessary to identify the disable register in a subsequent register identifier sent over the first communication link, and thereafter to update the disable register with the information subsequently received on the second communication link.

In one embodiment, each test wrapper unit has an input interface for receiving data from the second communication link and an output interface for outputting data on the second communication link, and is operable to selectively place registers of said plurality in a connecting path between said input interface and said output interface to allow data to be shifted in and out of those registers. Said plurality of registers include a bypass register, and when the register identifier received over the first communication link identifies the bypass register, the subsequent data received over the second communication link is stored in the bypass register to identify whether the test wrapper unit is to be bypassed. Further, when the bypass register indicates that the test wrapper unit is to be bypassed, the test wrapper unit is operable to logically connect the input interface to the output interface without placing any registers in the connecting path. In an alternative embodiment, a single delay element (for example a D flip flop) can be introduced between the input interface and the output interface if required for timing reasons.

Through the use of such a bypass register whose contents are updated via the second communication link, individual test wrapper units can be bypassed. This can significantly reduce the time taken to send a new set of second test data via the second communication link to the various test wrapper units. For example, if in a normal update of a sequence of registers in each of the test wrapper units, the registers placed in the connecting path between the input interface and the output interface collectively contain a large number of bits, then because of the nature of the second communication link whereby each test wrapper unit is connected in an ordered sequence with the test controller, the routing of the second test data through all of the test wrapper units can take a long period of time. If however the test controller has decided that the particular test in question need not be applied to one or more of the test wrapper units, then by bypassing these test wrapper units, the length of the effective scan chain provided via the second communication link can be significantly reduced, since for each of the bypassed test wrapper units the input interface is connected logically with the output interface without placing any registers in the connecting path.

Viewed from a second aspect, the present invention provides a method of performing a sequence of tests in order to seek to detect memory defects in a plurality of memory units within an integrated circuit, the integrated circuit including memory test logic comprising a plurality of test wrapper units and a test controller, each test wrapper unit being associated with one of said memory units, the method comprising the steps of: employing each test wrapper unit to execute tests on its associated memory unit; controlling performance of the sequence of tests by communicating via the test controller with each of the test wrapper units to provide test data defining each test to be executed by that test wrapper unit; and when controlling performance of the sequence of tests, the test controller providing first test data via a first communication link connecting each of the test wrapper units directly with the test controller, and providing second test data via a second communication link connecting each test wrapper unit in an ordered sequence with the test controller.

BRIEF DESCRIPTION OF THE DRAWINGS

The present invention will be described further, by way of example only, with reference to an embodiment thereof as illustrated in the accompanying drawings, in which:

FIG. 3B is a table illustrating the effect of various data values placed in the address register of FIG. 2;

DESCRIPTION OF AN EMBODIMENT

Figure 1:
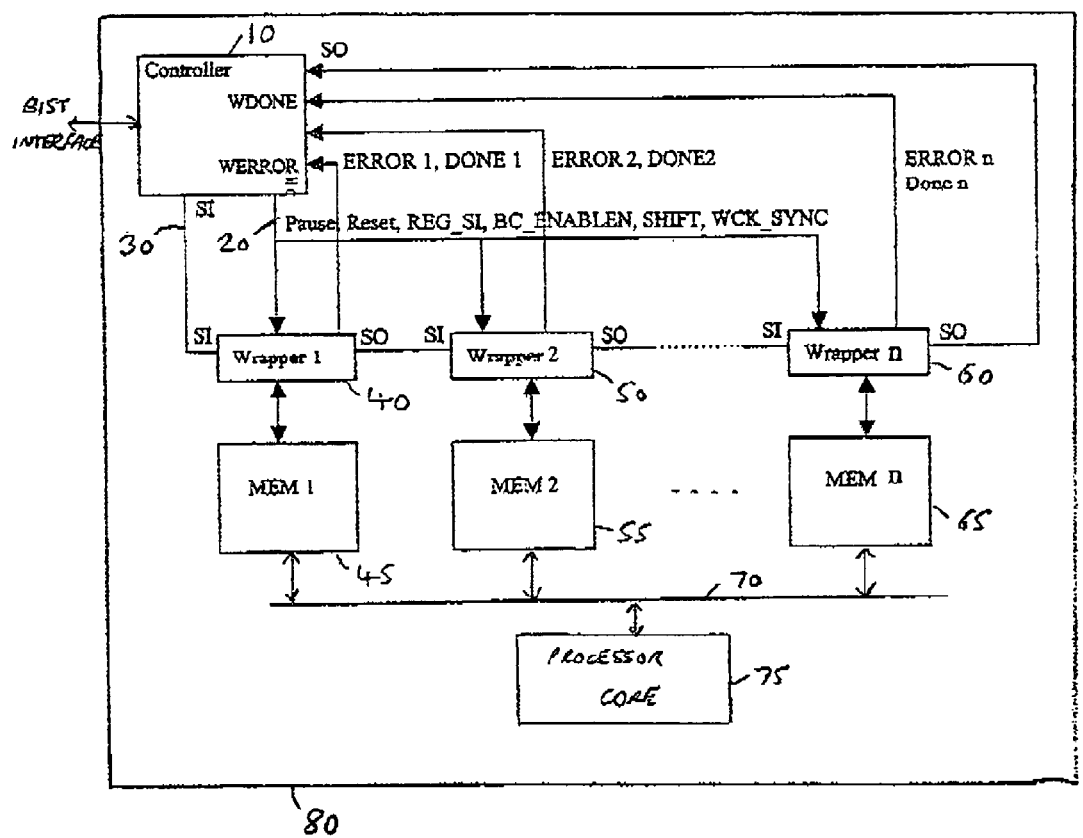
FIG. 1 is a block diagram of an integrated circuit in accordance with an embodiment of the present invention.

FIG. 1 is a block diagram of an integrated circuit in accordance with one embodiment of the present invention. The integrated circuit may take a variety of forms, but in one example may be a System-on-Chip (SoC). The integrated circuit 80 has a processor core 75 arranged to perform a number of data processing operations, during which data will typically be written to one or more of the memory units 45, 55, 65 and/or read from one or more of the memory units 45, 55, 65 via the bus network 70.

The memory units 45, 55, 65 may take a variety of forms, but in one embodiment may include caches and/or other types of embedded memory, for example Tightly Coupled Memory (TCM), Random Access Memory (RAM), etc. Further, whilst each of the memory units 45, 55, 65 may be physically separate memory units, there is no requirement for them to be physically separate, and alternatively each of the memory units may represent logically distinct portions of memory. For the purposes of the illustration of FIG. 1, it will be assumed that each of the memory units 45, 55, 65 is of the same type of memory and in accordance with one embodiment of the present invention these memory units can be connected to a single BIST controller 10 via associated BIST wrapper units 40, 50, 60, respectively.

Whilst in FIG. 1 only three memories and associated BIST wrapper units are shown, the number of memories and associated BIST wrapper units can be varied as required, as indicated by the dotted lines between memory 2 55 and memory n 65, and between wrapper 2 50 and wrapper n 60.

Each of the BIST wrapper units 40, 50, 60 communicates with the controller 10 via a serial communication protocol. In accordance with an embodiment of the present invention, two scan chains are used, namely a first scan chain 20 used to connect each of the test wrapper units 40, 50, 60 directly with the test controller 10, and a second scan chain 30 used to connect each test wrapper unit 40, 50, 60 in an ordered sequence with the test controller 10. In one embodiment, the first scan chain 20 is used to broadcast test data required by each of the test wrapper units to those test wrapper units, and accordingly will also be referred to herein as the broadcast scan chain. The second scan chain 30 is used to disseminate test wrapper unit specific test data and this will be routed sequentially through the first wrapper unit 40, the second wrapper unit 50, one or more subsequent wrapper units, and the final wrapper unit 60. In particular, dependent on the mode of operation, selected registers within each wrapper unit will be connected between the serial in (SI) and serial out (SO) ports of each wrapper unit, and the controller 10 will output a sequence of bits for storing in those registers. Hence, as an example, the controller will output test data for the final wrapper 60 followed by test data for any intervening wrappers, followed by test data for wrapper 50, followed by test data for wrapper 40, with that data sequence being clocked sequentially through the sequence of wrappers, such that by the time the test data for the wrapper 60 has been clocked into the registers within that wrapper, the test data for the wrapper 50 has likewise been clocked into the registers of wrapper 50 and the test data for the wrapper 40 has been clocked into the registers of wrapper 40. Whilst this is going on, the previous contents of those registers will also have been clocked out of the registers and returned via the SO port of the wrapper 60 back to the controller 10.

Each wrapper unit 40, 50, 60 has a port connecting it to the broadcast scan chain 20, this port being referred to herein as the REG_SI port. This port is the serial broadcast input from the controller 10. An enable signal referred to in FIG. 1 as the BC_ENABLEN signal is used to control what each wrapper unit does with the contents received at the REG_SI port, as will be discussed in more detail later. A SHIFT signal is also output over the broadcast scan chain 20, which controls the operation of registers within each wrapper unit loading data from the respective SI port of the second scan chain 30.

Figure 6:
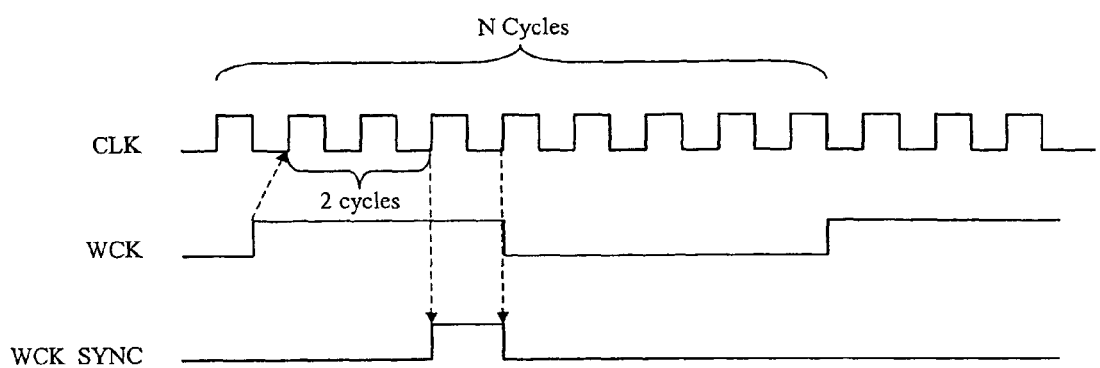
FIG. 6 is a timing diagram illustrating the synchronisation of a system clock signal with a test clock signal in accordance with one embodiment of the present invention.

As also shown in FIG. 1, various other control signals can be issued over the broadcast scan chain 20, for example to pause operation of the wrapper units, to reset the wrapper units, etc. In addition, a clock synchronisation signal is issued over the broadcast scan chain 20, referred to as the WCK_SYNC signal, to synchronise the operation of the wrapper units 40, 50, 60 with the data output by the controller 10. In particular, as illustrated schematically in FIG. 6, each test wrapper unit 40, 50, 60 is arranged to use the system clock signal (CLK), which is the same clock frequency as used by the memory units 45, 55, 65, whilst the actual controller 10 is arranged to operate using a slower frequency test clock signal (WCK). In one particular example the frequency of the WCK signal is less than ⅙ times the frequency of the CLK signal.

The benefit of operating the test wrapper units 40, 50, 60 at the higher system clock frequency is that it avoids the complexity of routing the test clock to all of the individual wrapper units, which will typically be placed in proximity to their associated memory units to assist in the timing of execution of the individual tests on their associated memory units. Further, by running each test wrapper unit at the system clock frequency, the test can be carried out at the full operating frequency of the memory units, thereby providing more reliable testing. However, the use of the two different clocks for the wrapper units and the controller present a potential problem with regard to synchronisation. In accordance with one embodiment of the present invention, this is solved by causing the controller 10 to issue the clock synchronisation signal via the broadcast scan chain 20 when it is desired to synchronise the high speed system clock with the low speed test clock, as is illustrated schematically by FIG. 6. Hence, it will be appreciated that the synchronisation signal issued by the test controller over the broadcast scan chain can trigger the plurality of test wrapper units 40, 50, 60 to read test data from either the broadcast scan chain 20 or the second scan chain 30.

As also shown in FIG. 1, each BIST wrapper unit 40, 50, 60 is able to issue error and done signals back to the controller 10. In particular, when a particular BIST test operation has been completed, each test wrapper unit can issue a done signal back to the controller to confirm that the test has completed. Further, if an error is detected whilst performing the test, an error signal can be returned form the relevant test wrapper unit to the controller 10.

Figure 2:
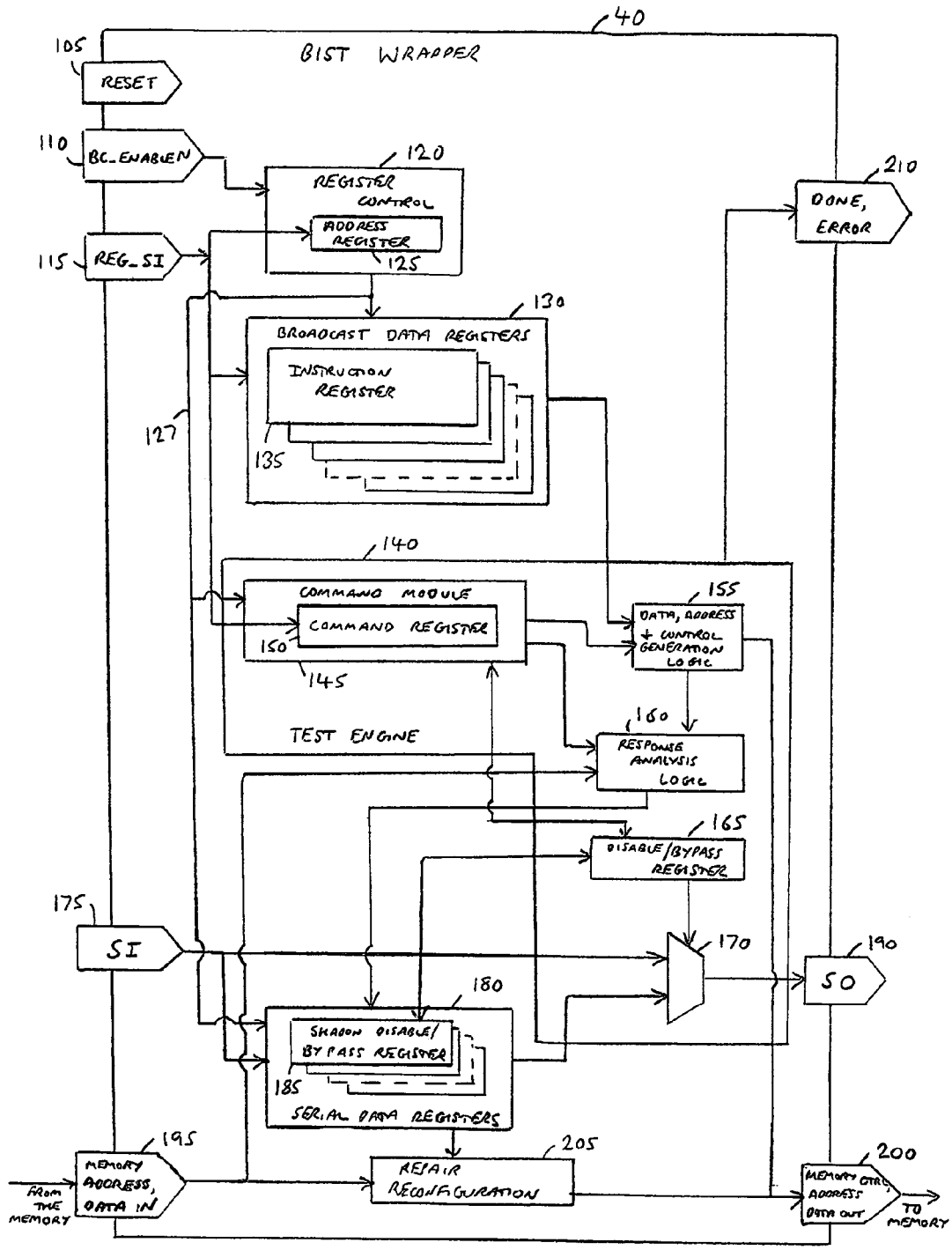
FIG. 2 is a block diagram illustrating in more detail the construction of a BIST wrapper unit in accordance with one embodiment of the present invention.

FIG. 2 is a block diagram illustrating in more detail the elements provided within each BIST wrapper unit 40, 50, 60 of FIG. 1. In particular, the BIST wrapper unit 40 is illustrated in FIG. 2, but in one embodiment each of the test wrapper units 50, 60 also has the same structure. As shown in FIG. 2, the BIST wrapper unit 40 has a plurality of registers operable to store test data for access by a test engine 140 provided within the BIST wrapper unit 40. In particular, the plurality of registers comprise a set of broadcast data registers 130, a set of serial data registers 180, and a command register 150 which is conceptually one of the broadcast data registers 130, but is shown separately in FIG. 2 as it can be considered to be part of a command module 145 provided within the test engine 140.

The storing of test data into these various registers is controlled by a register control block 120 which contains an address register 125. In particular, when the BC_ENABLEN signal 110 is low (this being an active low signal), the address register 125 loads a 3-bit address from the REG_SI port 115. Then when the BC_ENABLEN signal transitions from low to high, the contents of the address register 125 are locked, and those contents are used to identify the register or registers that are to subsequently receive data from either the REG_SI port 115 of the broadcast scan chain 20, or the SI port 175 of the second scan chain 30. Hence, if one of the broadcast data registers 130, 150 is identified by the contents of the address register, then the register control block 120 will send a control signal to that broadcast data register over path 127 to cause it to then store the data bits provided on the REG_SI port 115 whilst BC_ENABLEN is high. Similarly, if the address register 125 identifies one or more of the serial data registers 180, then a control signal will be sent to the relevant serial data registers via the control path 127 to cause those registers to store the data subsequently received over the SI port 175 of the second scan chain. Registers loading from the SI port 175 accept input when the SHIFT signal broadcast over the broadcast scan chain 20 is high and lock when that SHIFT signal transitions to low.

Figure 7A:
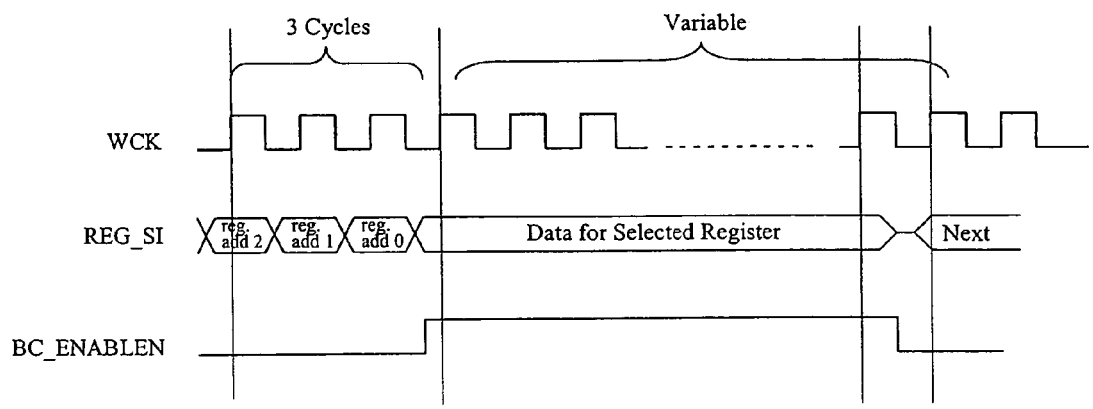
FIGS. 7A and 7B are timing diagrams illustrating the steps taken to shift data into selected registers of the BIST wrapper unit of FIG. 2 using either of the two available scan chains illustrated in FIG. 1.
Figure 7B:
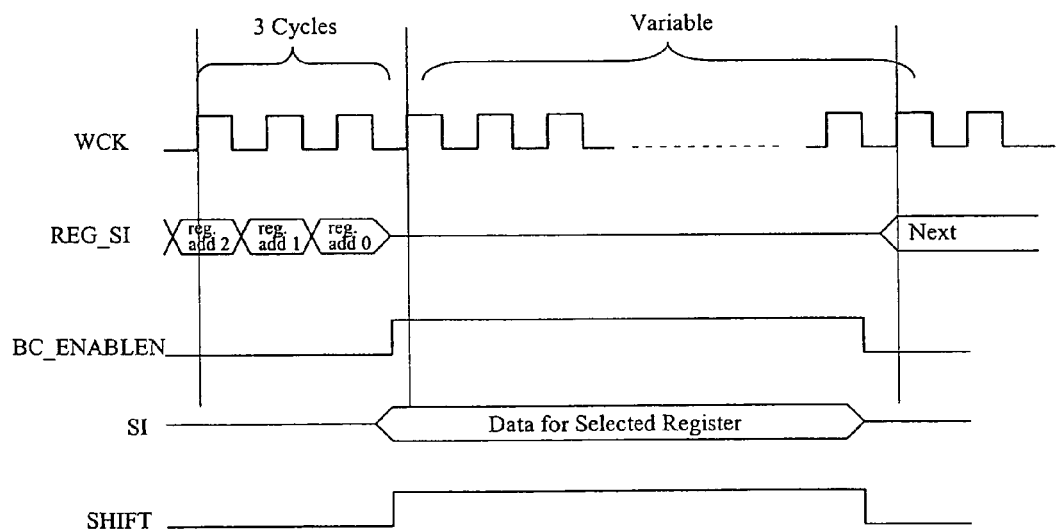

The above register update process is illustrated schematically in FIGS. 7A and 7B. FIG. 7A is a timing diagram illustrating how the broadcast data registers are updated based on data received via the REG_SI port 115. In particular, the update occurs based on the slower test clock WCK even though the test wrappers operate at the faster system clock CLK, this being achieved using the synchronisation signal broadcast over the broadcast scan chain 20 as discussed earlier with reference to FIG. 6. As shown in FIG. 7A whilst the BC_ENABLEN signal is low, three register address bits are shifted into the address register 125, whereafter the BC_ENABLEN signal transitions high. At this point assuming those three address bits identify a particular broadcast register, then during subsequent clock cycles the data for that selected broadcast register is routed into that register from the REG_SI port. When the required data has been shifted into the broadcast register, the BC_ENABLEN signal will transition low to trigger the storing of the next address in the address register 125.

As mentioned earlier, in some cases the address stored in the address register 125 refers to a mode of the second scan chain 30, and in particular identifies one or more of the serial data registers 180 that are to be placed between the SI port 175 and the SO port 190 to receive data input via this scan chain. This process is illustrated schematically in FIG. 7B. In particular, in the same way as described earlier with reference to FIG. 7A, whilst the BC_ENABLEN signal is low, three bits are shifted into the address register 125, whereafter the BC_ENABLEN signal transitions high. Also, at this time, the SHIFT signal broadcast on the broadcast scan chain 20 will be set high, whereafter data subsequently received via the SI port 175 will be shifted into the selected register or registers from the serial data register set 180, the actual registers selected being dependent on the mode specified by the address in the address register 125.

As will be discussed later with reference to FIGS. 4 and 5, when the command register 150 is updated, this will cause the command module 145 to execute the command specified within the register. If that command is a start BIST command, also referred to herein as a run test command, then this will cause a control signal to be sent from the command module 145 to the data, address and control generation logic 155 to cause that logic to execute a test specified by an instruction stored in the instruction register 135. The instruction in the instruction register specifies the type of test that will be executed by the test engine and results in the generation of control, address and data which is output via the port 200 to the associated memory unit. Typically, this same data will then be read back from memory via the memory address and data in port 195, whereupon it will be analysed by the response analysis logic 160. In particular, the command module 145 will inform the response analysis logic when to review the responses returned from memory, and the data, address and control generation logic 155 will identify to the response analysis logic 160 what data to look for.

The results of the response analysis will typically be stored back into one of the serial data registers 180 from the response analysis logic 160. Further, if any errors are detected by the response analysis logic 160, for example because the data read back from memory does not correspond with what the data, address and control generation logic 155 has identified the data should be, then the test engine will output an error signal via the done/error port 210. When the sequence of tests specified by the instruction in the instruction register 135 have been performed, then the command module 145 will cause the test engine 140 to issue a done signal back to the controller 10 via the done/error port 210.

As shown in FIG. 2, a disable/bypass register 165 is used to control a multiplexer 170, the multiplexer receiving at its first input the input received at the SI port 175, and receiving at its second input the data as shifted through a selected one or more of the serial data registers 180 in dependence on the control signal received from the register control logic 120 over path 127. If the first input of the multiplexer is selected for output, this effectively couples the SI port 175 to the SO port 190 without any intervening serial data registers in the path, whilst if the second input is selected, then the selected serial data registers are placed in a connecting path between the SI port 175 and the SO port 190.

As also shown in FIG. 2, one of the serial data registers is a shadow disable/bypass register 185. When the address register 125 identifies the shadow disable/bypass register 185, then this register is placed between the SI port 175 and the SO port 190, and data subsequently received over the SI port 175 is shifted into the shadow disable/bypass register. Once this shift process is complete, if a special update instruction (to be described later with reference to FIG. 4) is issued, the contents of the shadow disable/bypass register are then copied to the disable/bypass register 165 to thereafter control the multiplexer 170. In particular, the disable/bypass register 165 can be implemented as a two bit register, one bit being a "disable" bit and one bit being a "bypass" bit. The meanings associated with these bits is in one embodiment as shown in Table 1 below:

TABLE 1

| Disable | Bypass | Operation |
|---|---|---|
| 0 | 0 | Normal BIST operation |
| 0 | 1 | Wrapper is bypassed for the serial scan chain but continues to read from the broadcast scan chain (which could for example be used to reload the disable/bypass register) |
| 1 | 0 | Wrapper function is disabled but it continues to read from its scan chains |
| 1 | 1 | Wrapper is disabled and bypassed and can only be taken out of this state by resetting it |

When the wrapper is disabled, its done bit output from port 210 will be permanently set to one, and its error flag will be permanently set to zero. The remaining registers will hold whatever value they held before the wrapper was disabled and are still accessible for scanning. The disable function may be used to bypass a defective wrapper, to conserve power during BIST mode, or for debug purposes. In one embodiment, once it has been disabled, the wrapper will not respond to any additional instructions, nor will it apply any test to memory.

When the wrapper is bypassed, this will cause a control signal to be issued to the multiplexer 170 to cause it to select as its output its first input, thereby effectively coupling the SI port 175 to the SO port 190 without any intervening registers (or alternatively they may be separated by a single delay element for chip timing reasons).

Upon a reset being performed, the contents of the disable/bypass register are in one embodiment reset to "00" i.e. enabled and not bypassed.

As shown in FIG. 2, the BIST wrapper logic 40 may optionally include repair reconfiguration logic 205 which can receive data from the memory via the memory address and data in port 195, perform some repair reconfiguration process on that data, and then reissue that data to memory via the memory control, address and data out port 200. In one embodiment, one of the serial data registers 180 is a reconfiguration register which specifies the type of reconfiguration to be performed by the repair reconfiguration logic 205.

Figure 3A:
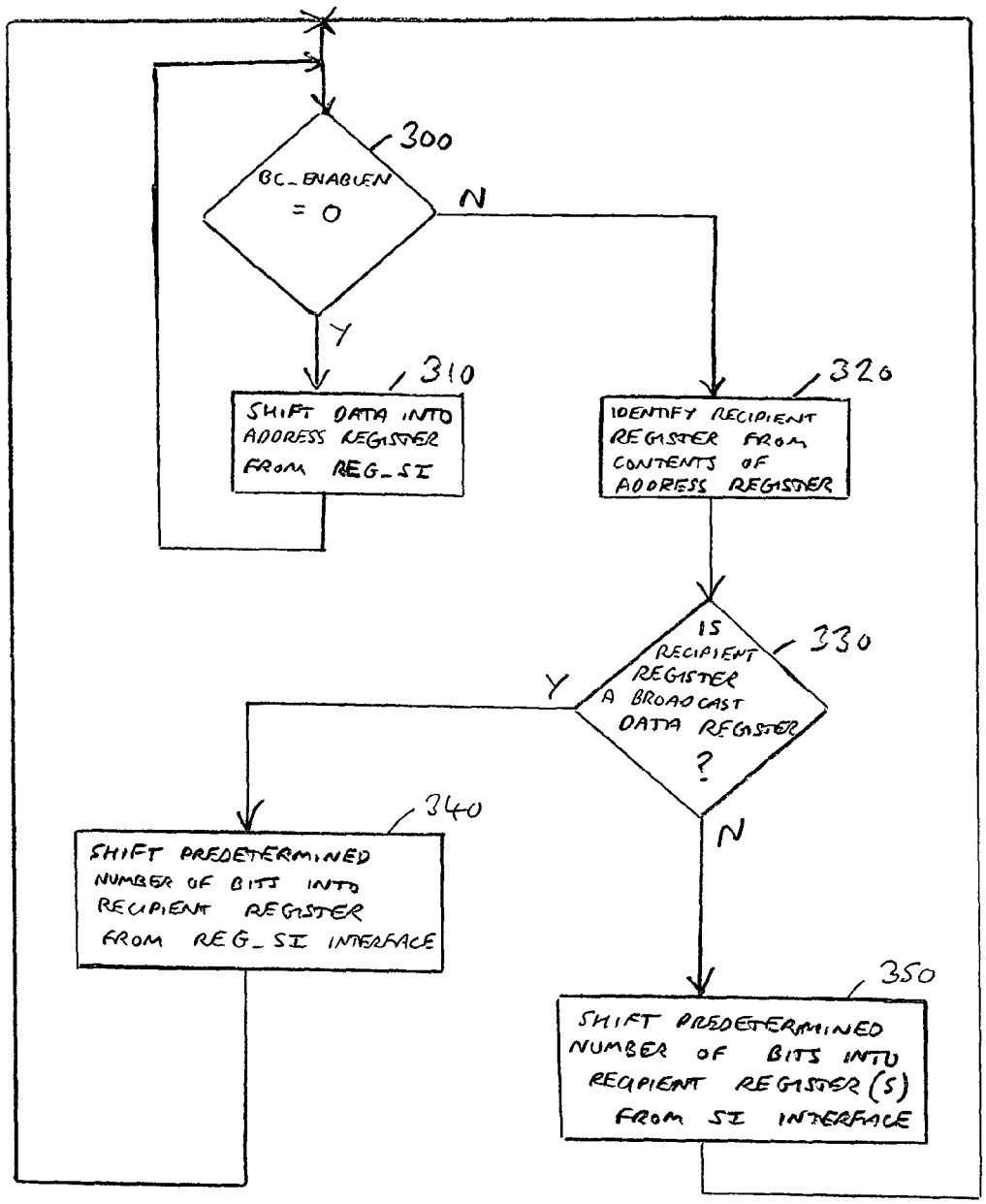
FIG. 3A is a flow diagram illustrating the register data flow within the BIST wrapper unit of FIG. 2 in accordance with one embodiment.

FIG. 3A is a flow diagram illustrating the register data flow within the BIST wrapper 40 of FIG. 2. At step 300, it is determined whether the BC_ENABLEN signal at port 110 is low. If so, then data is shifted into the address register 125 at step 310 from the REG_SI port 115. Whilst BC_ENABLEN is retained at a low level, the process at step 310 continues for each bit in turn. When it is subsequently determined that the BC_ENABLEN signal 300 has transitioned high, then the process branches to step 320, where a recipient register for subsequent test data is identified from the contents of the address register 125. As discussed earlier with reference to FIG. 2, the registers within the BIST wrapper 40 fall into two categories, namely broadcast data registers that receive their data from the broadcast scan chain 20, and serial data registers that receive their data from the second scan chain 30. At step 330, it is determined whether the recipient register is a broadcast data register. If so, then the process branches to step 340 where a predetermined number of bits are shifted into the recipient register from the REG_SI interface. In particular, this shift process will continue until the BC_ENABLEN signal transitions to low, this being under the control of the test controller 10. In particular, the various registers that can be selected will be of different sizes, and the test controller 10 will know the size of these registers, and hence will know how many shift operations need to be performed in order to shift a new set of test data into the recipient register. Once the predetermined number of bits have been shifted into the recipient register at step 340, the process returns to step 300, wherein at this point it will be determined that the BC_ENABLEN signal has transitioned to low.

Returning to step 330, if the recipient register is not a broadcast data register, i.e. it is a serial data register, or a sequence of serial data registers, then the process proceeds to step 350, where a predetermined number of bits are shifted into the recipient register(s) from the SI interface 175. In particular, this shift process will continue whilst the SHIFT signal broadcast on the broadcast scan chain 20 is set high, which is under the control of the test controller 10. Once the predetermined number of bits have been shifted into the recipient register(s), then the process will return to step 300, where it is determined whether the BC_ENABLEN signal is at a logic zero level. Typically the transitions of the BC_ENABLEN signal and the SHIFT signal will be coupled such that when the SHIFT signal transitions low the BC_ENABLEN signal will also transition low. However, in one embodiment the BC_ENABLEN signal and SHIFT signal can be decoupled from one another, so as to enable "flow through" testing of the scan chain, where data is shifted in to the sequence of wrappers from the test controller 10 and then checked again when it comes back out of the sequence of wrappers to ensure integrity of the scan chain.

FIG. 3B is a table illustrating the various recipient registers associated with the possible values in the address register, which in this embodiment is considered to be a 3-bit address register. As can be seen, there are four broadcast registers that can be identified, namely the command register, the instruction register, a start address register and a write mask register. These registers will be discussed in more detail later. Similarly, there are four types of serial data register that can be identified, namely the disable/bypass register, the reconfiguration register, a status register or a full serial register. At least with regard to the last of these four, the value in the address register is not merely identifying a single register, and accordingly for the serial registers, the value in the address register can be viewed as identifying a mode of the scan chain 30. In accordance with the different modes, different registers of the serial data registers are selected for coupling between the SI port 175 and the SO port 190. Details of these different modes will be provided later.

Figure 4:
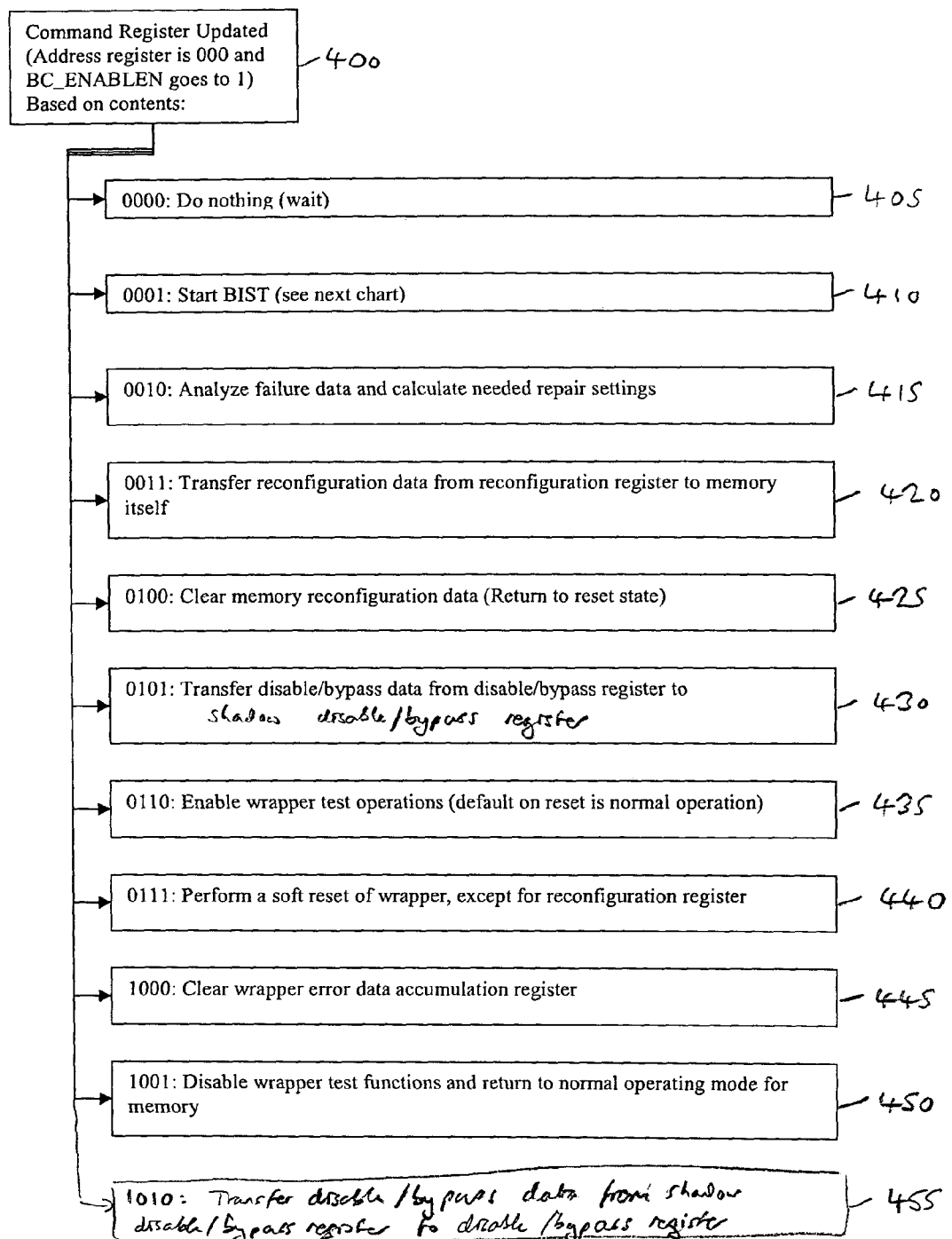
FIG. 4 is a diagram illustrating the operation of the wrapper unit dependent on the command register of FIG. 2 in accordance with one embodiment.

FIG. 4 is a diagram illustrating schematically what action is taken when the command register 150 is updated. As will be appreciated from the earlier described FIGS. 3A and 3B, and encapsulated by step 400 of FIG. 4, the command register will be updated when the address register 125 is updated with the value "000" and the BC_ENABLEN signal subsequently transitions high. The command register is a 4-bit register and the steps 405 through 450 illustrate the possible different operations that will be performed by the command module 145 dependent on the value of those 4 bits in the command register 150. In particular, as shown by step 405, if the value is "0000" the test wrapper will continue to execute any commands that have started but have not yet finished but will otherwise take no further action. If alternatively the value is "0001", then this will cause the test engine 140 to perform a particular BIST test process based on the instruction in the instruction register 135 (step 410).

If the value in the command register is "0010", then as shown by step 415 this will cause the test engine 140 to analyse any failure data and to calculate needed repair settings for use by the repair reconfiguration logic 205. If the command register value is "0011", then this will cause the reconfiguration data stored within the reconfiguration register (as mentioned earlier this being one of the serial data registers 180) to be transferred to memory via the repair reconfiguration logic 205 (step 420). If the command register value is "0100", then as shown at step 425 this will cause the memory reconfiguration data in the reconfiguration register to be reset to a default value (i.e. no reconfiguration).

If the command register value is "0101", then as shown by step 430 this will cause the data in the disable/bypass register 165 to be transferred to the shadow disable/bypass register 185. This is useful for diagnostic purposes. As also shown by step 455 in FIG. 4, if the command register value is 1010, then this will cause transfer of data in the opposite direction, i.e. the data in the shadow disable/bypass register 185 is transferred to the disable/bypass register 165. This enables updated disable/bypass data to be shifted into the shadow disable/bypass register without interfering with the operation of the multiplexer 170 of FIG. 2 whilst the update is taking place. Then, when the update has completed, this command can be used to update the contents of the disable/bypass register 165, whereafter the multiplexer 170 is controlled in accordance with the updated disable/bypass data.

A value of "0110" as shown at step 435 causes certain wrapper test operations to be enabled, the default operation being a normal operation which is defaulted to upon reset. If the value is "0111", then this causes the test engine to perform a soft reset of the wrapper, with the exception of the reconfiguration register which is left unchanged. If the value in the command register is "1000", then as shown at step 445 this causes the test engine 140 to clear the contents of a error data accumulation register, this being one of the serial data registers 180 used to keep a record of any errors that have accumulated since the register was last reset. Finally, if the command register value is "1001", then as shown at step 450 this causes the test engine to disable wrapper test functions and return to a normal operating mode for the memory.

Figure 5:
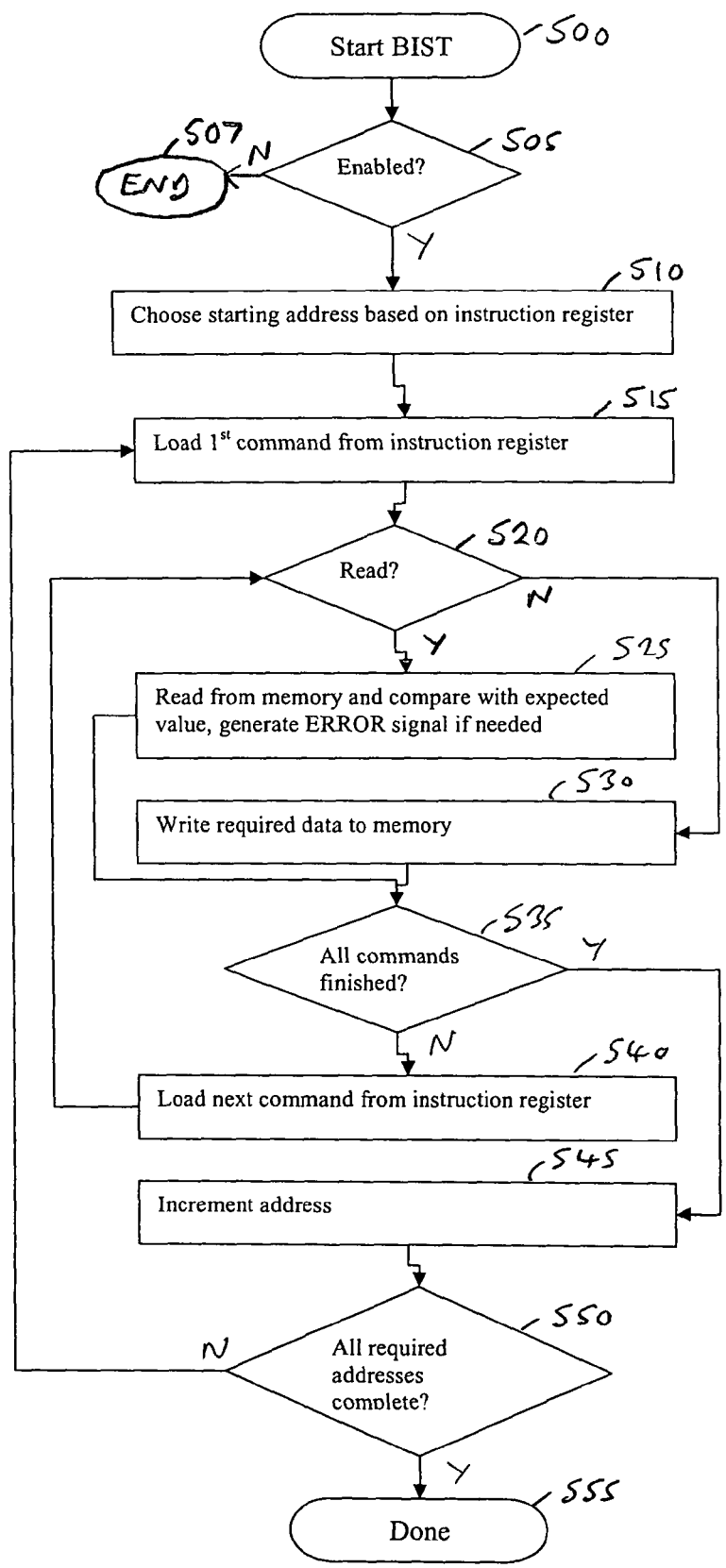
FIG. 5 is a flow diagram illustrating execution of a BIST test operation within the BIST wrapper unit of FIG. 2 in accordance with one embodiment.

FIG. 5 is a flow diagram illustrating the steps performed if the command register has the value "0001", and accordingly a start BIST command is identified in the command register. At step 500, the BIST operation is initiated, whereafter at step 505 it is determined whether the test wrapper is enabled. If the wrapper is not enabled, then the process ends at step 507, i.e. no further action is taken.

Assuming at step 505 it is determined that the wrapper is enabled, then at step 510 a starting address is selected based on the contents of the instruction register 135. Thereafter, at step 515 a first command is loaded from the instruction register, whereafter at step 520, it is determined whether that command is a read command. If it is a read command, then the data at the chosen address is read from memory and compared with an expected value by the response analysis logic 160, with an error signal being generated if needed. Alternatively, if the command is not a read command, then it will be a write command, and step 530 the required data will be written to memory by the data, address and control generation logic 155.

At step 535, it will be determined whether all commands specified by the instruction have been completed. If not, then the next command will be loaded from the instruction register at step 540, whereafter the process will return to step 520. However, assuming all commands have been completed, then the process branches to step 545, where the address is incremented. Then, at step 550 it is determined whether all required addresses have completed, and if not the process returns to step 515. When at step 550 it is determined that all the commands have been completed for all of the required addresses, then the process proceeds to step 555, where a done signal is output from port 210 back to the test controller 10.

Considering again FIG. 3B, the various forms of the command within the command register have been described with reference to FIGS. 4 and 5. The contents of the other registers mentioned in FIG. 3B in accordance with one particular embodiment of the present invention will now be described. In particular, the remaining three broadcast registers identified in FIG. 3B will be discussed first.

In one embodiment, the Instruction Register is a 24-bit register that is loaded from REG_SI when BC_ENABLEN is high and when its address is contained in the Address Register. This register is used to specify the type of test that will be run by the wrapper test engine.

The details of the instruction register bits in one embodiment are shown below:
0. Write enable test mode: 0=normal test, 1=write enable test
1. Address increment mode: 0=increment, 1=decrement
2. Address step mode: 0=column first, 1=row first
3. Address sequence mode: 0=all addresses, 1=single step
4. Checkerboard mode: 0=off, 1=force data into physical checkerboard
5. Write enable, March element 1, 0=write, 1=read
6. Data bit 0, March element 1
7. Data bit 1, March element 1
8. Last flag, March element 1, 1 means that this is the last operation of the March pass
9. Write enable, March element 2, 0=write, 1=read
10. Data bit 0, March element 2
11. Data bit 1, March element 2
12. Last flag, March element 2, 1 means that this is the last operation of the March pass
13. Write enable, March element 3, 0=write, 1=read
14. Data bit 0, March element 3
15. Data bit 1, March element 3
16. Last flat, March element 3, 1 means that this is the last operation of the March pass
17. Write enable, March element 4, 0=write, 1=read
18. Data bit 0, March element 4
19. Data bit 1, March element 4
20. Last flag, March element 4, 1 means that this is the last operation of the March pass
21. Write enable, March element 5, 0=write, 1=read
22. Data bit 0, March element 5
23. Data bit 1, March element 5

Example Instructions:
Write physical checkerboard, main data pattern 00, row first, for entire memory starting from address 0, column first
XXX XXXX XXXX XXXX 1000 10000
Sample element from March LR':R1, W0, R0, R0, W1 ⇑, for entire memory starting from address 0, row first, no checkerboard
110 0001 0001 0000 0111 00100
Example single step, read 1, then write 0 to current address, no checkerboard, decrement column first:
XXX XXXX XXXX 1000 0111 01010

The Start Address Register is used in single step mode and is 8 bits in length, corresponding to an address space between 129 and 256 words in this embodiment. An address loaded into this register is used as the starting point for a single step instruction, unless it exceeds the address space of the memory, in which case no instruction is executed when the single step command is given.

The Write Mask Register is a 5-bit register determining which bits will be written during write enable test mode. When there are fewer write enable bits to the memory than bits in this register, only the least significant bits are used. When no write mask is present on the memory, a write enable test received by the wrapper will cause it to set its DONE bit to 1, and await further instructions.

Regarding the serial data registers 180, then as mentioned earlier, the scan chain 30 can support four different modes of operation, in each mode of operation, different registers being connected between the SI port 175 and the SO port 190. All of the registers are clocked by the high speed system clock signal, but the shifting of the data into those registers is gated using the synchronisation signal issued over the broadcast scan chain 20. The four modes used in one embodiment are detailed below:

Mode 1: Full Serial Mode (Default)
In this mode, the following registers are connected (in this order) between SI and SO:
Shadow Disable/Bypass register
Next State (wrapper controller)
Expected Q (wrapper controller)
Current address
TXORB (XOR of CEN, WEN, and address bus)
TXORA (XOR of CEN and address bus)
Reconfiguration Register
ERROR
Error Accumulation Register
DONE bit
REPAIR_STATUS bit (1 means repaired, 0 means not)
GOOD bit (1 means works, 0 means does not)
Mode 2: Reconfiguration Mode
In this mode, the following register is connected between SI and SO:
Reconfiguration Register
Mode 3: Status Mode
In this mode, the following registers are connected (in this order) between SI and SO:

DONE bit
REPAIR_STATUS bit
GOOD bit

Mode 4: Disable/Bypass Mode
In this mode, the following registers is connected between SI and SO:
Shadow Disable/Bypass Register As regards the individual registers mentioned above, the shadow disable/bypass register has been discussed earlier. The meanings of the other registers is as follows:
The Next State Register is used to enable the test engine 140 to keep track of the progress of execution of the instruction in the instruction register 135.
The Expected Q Register is 2 bits containing the currently expected data value from the memory output.
The Current Address Register contains the address accessed by the current instruction.
The TXORB bit contains the XORed value of CENB, WENB (if the write mask feature is enabled), and the AB address bus.
The TXORA bit contains the XORed value of CENA, PENA (if the pipeline feature is enabled) and the AA address bus.
The Reconfiguration Register contains the encoded value of any bit being replaced along with a single bit (the MSB) which indicates whether or not a repair is active.
The Error Register contains the logical OR of all of the bits in the Error Accumulation Register.
The Error Accumulation Register contains any errors that have accumulated since the register was last reset. A 1 in any bit position means that an error has been observed at that position.

The Status Register contains three bits. These are:
REPAIR_STATUS bit (1 means repaired, 0 means not)
GOOD bit (see following table for encoding)
DONE bit (see following table for encoding)

TABLE 2

| GOOD | REPAIR STATUS | Status of Memory after Repair Analysis |
|---|---|---|
| 0 | 0 | The memory is not repairable. More than one bit was found to be faulty. |
| 0 | 1 | The reconfiguration register was already configured with fuse information and a new fault was found. The memory is not repairable. |
| 1 | 0 | The memory is good with the current reconfiguration register setting. |
| 1 | 1 | The memory is repairable. The reconfiguration register should be loaded with the recommended setting. |

Figure 8:
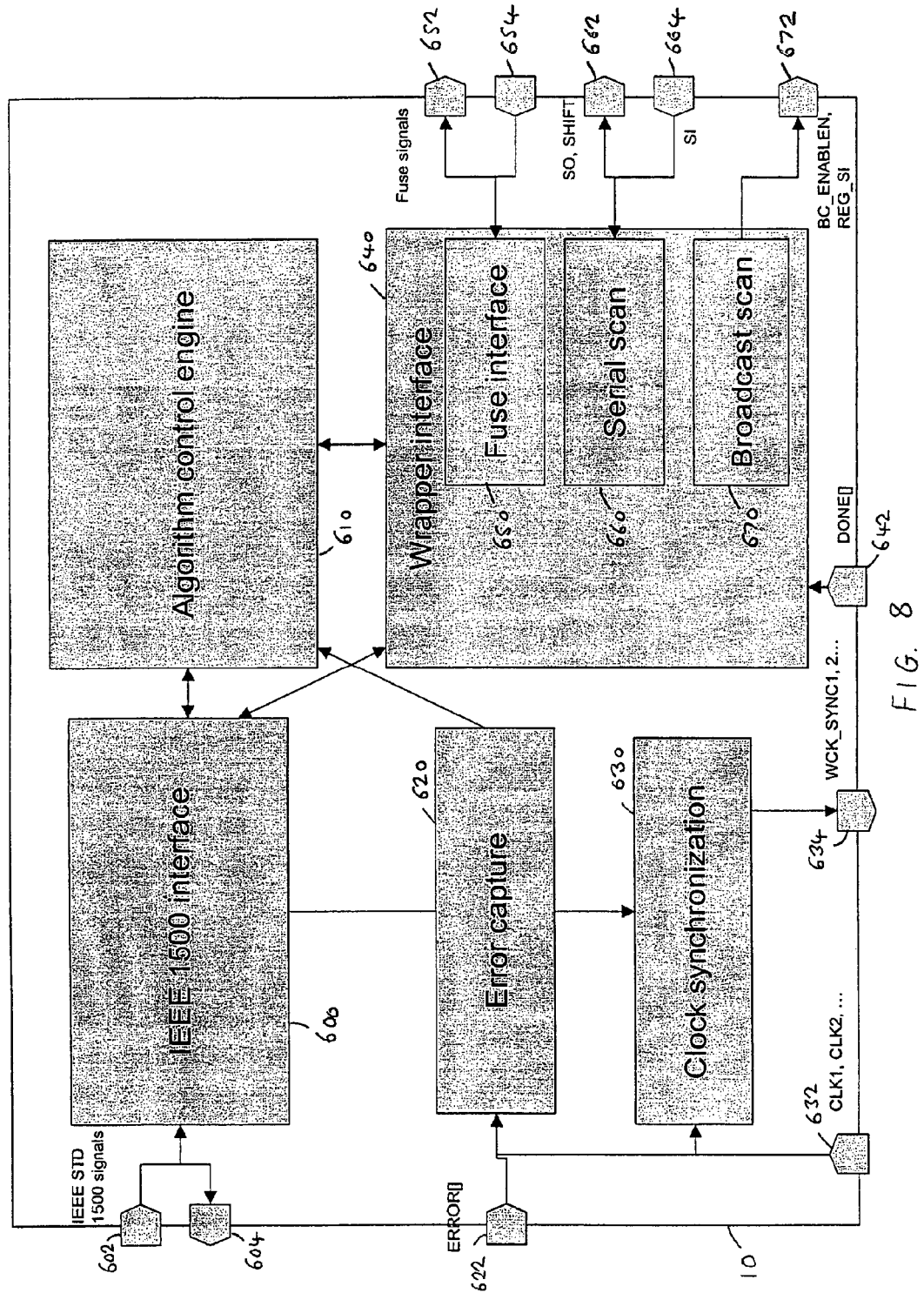
FIG. 8 is a block diagram illustrating in more detail the construction of the BIST controller of FIG. 1 in accordance with one embodiment of the present invention

FIG. 8 is a block diagram illustrating more details of the BIST controller 10 of FIG. 1 in accordance with one embodiment of the present invention. The BIST controller can be considered to consist of five basic components, namely an interface module 600, an algorithm control engine module 610, an error capture module 620, a clock synchronisation module 630, and a wrapper interface module 640.

The interface module 600 connects the controller 10 via ports 602, 604 of the BIST interface shown in FIG. 1 to chip-level test circuitry. In one embodiment, the interface module 600 communicates with the chip-level test circuitry via a communication method described in the IEEE 1500-2005 Standard entitled "IEEE Standard Testability Method for Embedded Core-based Integrated Circuits" (also referred to herein as the "IEEE 1500" Standard). It receives instructions and returns results. It may also use signal pins as equivalent to IEEE 1500 instructions, such as a power on test sequence, for example.

The algorithm control engine module 610 keeps track of the high level algorithm being run, e.g. power up test sequence, complex March algorithm, debug or diagnostic mode, etc. and directs the operation of all other modules of the controller 10. An algorithm can consist of an arbitrary number of commands for the various modules (an address decoder test, for example, can contain thousands of individual instructions).

The wrapper interface module 640 has three basic functions. It communicates via fuse interface 650 and associated ports 652, 654 with a remote fuse block, fuses being used to store reconfiguration data. Further, the wrapper interface module 640 provides a serial scan interface 660 and a broadcast scan interface 670 for operating the two scan chains 30, 20 to communicate with the wrappers via ports 662, 664 and 672, respectively. As an example, the algorithm control engine module 610 could instruct the wrapper interface module 640 to send a particular instruction to the wrappers. In this instance, the wrapper interface module 640 may send that instruction through the broadcast scan interface 670, then monitor the DONE[ ] signals received at port 642, and report when the wrappers have completed the assigned task.

The clock synchronisation module 630 generates the WCK_SYNC signal for each system clock domain used by any wrapper based on the system clock signal(s) received over path 632. Two methods can be used. Firstly, for a system clock operating at a frequency greater than or equal to 6 times the WCK frequency, the pulse capture method discussed earlier with reference to FIG. 6 can be used. Alternatively, for a divided clock based on WCK and of at least 4 times the WCK frequency, a simple pulse transfer method can be used, where the WCK_SYNC signal will be raised every $4^{th}$, $8^{th}$, $16^{th}$ etc. pulse to correspond roughly with the falling edge of WCK.

The error capture module 620 continuously monitors the error signals returning from the wrappers via the port 622. Any time an error is observed on any of the signals, it flags and records it until it receives a reset signal from the algorithm control engine module 610. This error capture module is used for "pause on error" capability, as well as for providing a rapid indication of an error anywhere in the system of wrappers managed by the controller.

The following is an example sequence of operations that may take place within the controller 10 in order to implement a March LR test:

1. The 1500 interface module 600 receives an instruction to run a March LR test.
2. The instruction is passed on to the algorithm control engine 610.
3. The algorithm control engine 610 sets up a loop, using the wrapper interface module 640, as follows:
    a. The March LR test is broken down into six separate instructions for the wrappers:
        i. W0 ⇑
        ii. R0, W1 ⇓
        iii. R1, W0, R0, R0, W1 ⇑
        iv. R1, W0 ⇑
        v. R0, W1, R1, R1, W0 ⇑
        vi. R0 ⇑
    b. The first instruction is passed to the wrapper interface module 640, encoded as "standard test type, full address sequence, address order increasing, column first, write operation, data background 00, end of test"
    c. The wrapper interface module 640 sends this instruction to the wrappers using the broadcast scan interface 670
    d. The wrapper interface module 640 waits for each of the wrappers to respond that it is "done"
    e. When all wrappers are done, the wrapper interface module 640 reports back to the algorithm control engine 610. It takes the next instruction from the list, encodes it as in step (b) above and repeats from there.
4. When all six passes of the March LR test are complete, the algorithm control engine 610 reports to the 1500 interface module 600 that it is done and the 1500 module interface is then available to receive new instructions.

Whilst in one embodiment, the scan chain 20 has been described as a broadcast scan chain disseminating information in parallel to each of the wrapper units, in an alternative embodiment each wrapper unit 40, 50, 60 can be provided with a unique address, which may for example be loaded via the scan chain 30. Test data output over the scan chain 20 could then be directed to specific addresses or combinations of addresses, rather than being sent to all of the wrappers. However, in the embodiment described with reference to the figures, it should be noted that the same functionality can be achieved through use of the disable/bypass scheme described to enable selective wrappers to be disabled or bypassed as required.

Whilst in the above description of an embodiment, each of the registers has been described as having a specific size, it will be appreciated that these sizes can be varied dependent on the implementation.

From the above description of an embodiment of the present invention, it will be appreciated that the described embodiment provides an improved communication scheme between a BIST controller and an arbitrary number of associated memory units, each with an associated BIST wrapper unit. In particular, the described scheme allows an arbitrary number of memory BIST wrappers to be connected to a single controller, and is able to provide all test algorithm, data manipulation, reconfiguration, test result, and repair data needed for arbitrary memory testing. The approach is also expandable for future designs.

Further, the approach of the described embodiment allows the controller 10 to use a low speed test clock whilst the wrapper units use a high speed system clock, thereby avoiding the need to disseminate the test clock to each of the wrapper units. Further, the design provides significant and useful debug features, including the ability to bypass some wrappers and address only a subset of them. Further, the design uses two separate scan chains 20, 30, with device specific signals being transferred using the scan chain 30, whilst global information is disseminated using the broadcast scan chain 20. The use of the broadcast scan chain reduces wiring overhead when compared with a conventional bus arrangement, and allows for reconfiguration.

Although a particular embodiment of the invention has been described herein, it will be apparent that the invention is not limited thereto, and that many modifications and additions, may be made within the scope of the invention. For example, various combinations of the features of the following dependent claims could be made with the features of the independent claims without departing from the scope of the present invention.

We claim:

1. An integrated circuit, comprising:
    processing logic configured to perform data processing operations on data;
    a plurality of memory units configured to store data for access by the processing logic; and
    memory test logic configured to perform a sequence of tests in order to seek to detect memory defects in the plurality of memory units, the memory test logic comprising:
        a plurality of test wrapper units, each test wrapper unit associated with one of said memory units, and configured to perform tests on its associated memory unit;
        a test controller configured to control performance of the sequence of tests by communicating with each of the test wrapper units to provide test data defining each test to be executed by that test wrapper unit and to provide control signals to control execution of each test by that test wrapper unit;
        a first communication link configured to provide said test data to each of the test wrapper units directly from the test controller; and
        a second communication link configured to provide said test data to each test wrapper unit in an ordered sequence from the test controller, when controlling performance of the sequence of tests in a first mode of operation, the test controller providing said test data as first test data via the first communication link and in a second mode of operation the test controller providing said test data as second test data via the second communication link, and said test controller providing said control signals via the first communications link.

2. An integrated circuit as claimed in claim 1, wherein the first test data is test data required by each of the test wrapper units, and the first communication link is used to broadcast that first test data to the plurality of test wrapper units.

3. An integrated circuit as claimed in claim 1, wherein the second test data is test wrapper unit specific test data, and the second communication link is used to output a sequence of blocks of second test data, each block being received by one of the test wrapper units.

4. An integrated circuit as claimed in claim 1, wherein the test controller periodically issues an identifier signal over the first communication link, the identifier signal identifying the mode of operation, the plurality of test wrapper units determining from the identifier signal whether test data provided subsequent to the identifier signal will be received over the first communication link or the second communication link.

5. An integrated circuit as claimed in claim 1, wherein test results obtained from execution of a test are communicated from each test wrapper unit to the test controller via the second communication link.

6. An integrated circuit as claimed in claim 1, wherein the first and second communication links are serial data links.

7. An integrated circuit as claimed in claim 1, wherein:
the test controller uses a test clock signal and each of the plurality of test wrapper units use one or more system clock signals, each system clock signal having a higher frequency than the test clock signal; and
the test controller outputting a synchronisation signal over the first communication link to trigger the plurality of test wrapper units to read test data from the first or second communication links.

8. An integrated circuit as claimed in claim 1, wherein each test wrapper unit comprises:
a test engine for executing a test;
a plurality of registers for storing test data for access by the test engine; and
register control logic for receiving a register identifier over the first communication link, the register identifier identifying which of said plurality of registers is to receive test data subsequently received by the test wrapper unit from either the first communication link or the second communication link.

9. An integrated circuit as claimed in claim 8, wherein said plurality of registers include a command register, when the register identifier received over the first communication link identifies the command register, the subsequent data on the first communication link being stored in the command register to identify a command to be performed by the test engine.

10. An integrated circuit as claimed in claim 9, wherein said plurality of registers include an instruction register, when the command in the command register comprises a run test command, the test engine executing a test specified by an instruction in the instruction register.

11. An integrated circuit as claimed in claim 8, wherein:
said plurality of registers include a disable register, when the register identifier received over the first communication link identifies the disable register, the subsequent data received over the second communication link being stored in the disable register to identify whether the test wrapper unit is enabled or disabled; and
when the test wrapper unit is disabled the other registers in the plurality of registers are arranged to hold whatever data they held before the test wrapper unit was disabled.

12. An integrated, circuit as claimed in claim 11, wherein:
said plurality of registers includes a shadow disable register, when the register identifier received over the first communication link identifies the disable register, the subsequent data received over the second communication link being shifted into the shadow disable register to update that shadow disable register; and
when the update of the shadow disable register is complete the content of the shadow disable register being copied to the disable register to identify whether the test wrapper unit is enabled or disabled.

13. An integrated circuit as claimed in claim 8, wherein:
each test wrapper unit has an input interface for receiving data from the second communication link and an output interface for outputting data on the second communication link, and selectively places registers of said plurality in a connecting path between said input interface and said output interface to allow data to be shifted in and out of those registers;
said plurality of registers include a bypass register, when the register identifier received over the first communication link identifies the bypass register, the subsequent data received over the second communication link being stored in the bypass register to identify whether the test wrapper unit is to be bypassed; and
when the bypass register indicates that the test wrapper unit is to be bypassed, the test wrapper unit logically connecting the input interface to the output interface without placing any registers in the connecting path.

14. A method of performing a sequence of tests in order to seek to detect memory defects in a plurality of memory units within an integrated circuit, the integrated circuit including memory test logic comprising a plurality of test wrapper units and a test controller, each test wrapper unit being associated with one of said memory units, the method comprising the steps of:
employing each test wrapper unit to execute tests on its associated memory unit;
controlling performance of the sequence of tests by communicating via the test controller with each of the test wrapper units to provide test data defining each test to be executed by that test wrapper unit and providing control signals to control execution of each test by that test wrapper unit; and
when controlling performance of the sequence of tests, in a first mode of operation, the test controller providing said test data as first test data via a first communication link connecting each of the test wrapper units directly with the test controller, and in a second mode of operation the test controller providing said test data as second test data via a second communication link connecting each test wrapper unit in an ordered sequence with the test controller, and said test controller providing said control signals via the first communication link.

* * * * *